US009234278B2

(12) United States Patent
Chou et al.

(10) Patent No.: US 9,234,278 B2
(45) Date of Patent: Jan. 12, 2016

(54) CVD CONFORMAL VACUUM/PUMPING GUIDING DESIGN

(75) Inventors: You-Hua Chou, Taipei (TW); Chih-Tsung Lee, Hsinchu (TW); Chia-Ho Chen, Zhubei (TW); Chin-Hsiang Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 541 days.

(21) Appl. No.: 13/354,545

(22) Filed: Jan. 20, 2012

(65) Prior Publication Data

US 2013/0189851 A1 Jul. 25, 2013

(51) Int. Cl.
*C23C 16/00* (2006.01)
*C23C 16/44* (2006.01)
*C23C 16/455* (2006.01)

(52) U.S. Cl.
CPC ....... *C23C 16/4405* (2013.01); *C23C 16/45591* (2013.01)

(58) Field of Classification Search
CPC ..................... C23C 16/45591; C23C 16/4401; C23C 16/4412; C23C 16/45587; C23C 16/4405
See application file for complete search history.

(56) References Cited

U.S. PATENT DOCUMENTS 5,818,578 A * 10/1998 Inman et al. .................. 356/246
6,261,408 B1 * 7/2001 Schneider et al. ....... 156/345.26
6,325,855 B1 * 12/2001 Sillmon et al. ................ 118/715
6,513,452 B2 * 2/2003 Shan et al. ................ 118/723 E
7,648,610 B2 * 1/2010 Komiya et al. .......... 156/345.29
2005/0170668 A1 8/2005 Park et al.
2006/0102076 A1 * 5/2006 Smith et al. ................... 118/715
2009/0008369 A1 * 1/2009 Nozawa et al. .......... 219/121.54
2010/0247763 A1 * 9/2010 Coutu et al. ............... 427/248.1

FOREIGN PATENT DOCUMENTS

JP 62098727 A * 5/1987
JP S6298727 A 5/1987
KR 20050078010 A 8/2005
KR 1020060098289 A 9/2006
KR 20110006136 A 1/2011

OTHER PUBLICATIONS

Notice of Allowance dated Dec. 10, 2013 for Korean Patent Application No. 10-2012-0056797.

* cited by examiner

*Primary Examiner* — Gordon R Baldwin
*Assistant Examiner* — Charlee Bennett
(74) *Attorney, Agent, or Firm* — Eschweiler & Associates, LLC

(57) ABSTRACT

The present disclosure relates to a guiding element for guiding gas flow within a chamber. The guiding element includes a structure, one or more inlets, an outlet, and a transportation region. The one or more inlets are formed on a first side of the structure. The inlets have inlet sizes selected according to a removal rate and to mitigate gas flow variations within the chamber. The outlet is on a second side of the structure, opposite the first side of the structure. The outlet has an outlet size selected according to the removal rate. The transportation region is within the structure and couples or connects the inlets to the outlet.

12 Claims, 6 Drawing Sheets

312 → PROCESS GAS
314 → CLEANING GAS
SHOWERHEAD 306
PLASMA 304
302
HEATER 308
310
BYPRODUCT
322
328
326
330
310
BYPRODUCT
324
320
PUMP 316
318
SCRUBBER
300

534
532
530
520

CVD CONFORMAL VACUUM/PUMPING GUIDING DESIGN

BACKGROUND

Semiconductor device fabrication is a process used to create integrated circuits that are present in everyday electrical and electronic devices. The fabrication process is a multiple-step sequence of photolithographic and chemical processing steps during which electronic circuits are gradually created on a wafer composed of a semiconducting material.

The various processing steps fall into a number of categories including deposition, removal, patterning, and modification of electrical properties (i.e., doping). Chemical vapor deposition (CVD) is one of a number of commonly used processes for performing deposition processing steps. Typically, a CVD process involves exposing a wafer or substrate to one or more volatile precursors, which react and/or decompose on the wafer surface to produce a deposited layer. CVD processes are commonly used in semiconductor fabrication to form layers of polysilicon, silicon dioxide and silicon nitride.

DETAILED DESCRIPTION

Figure 1:
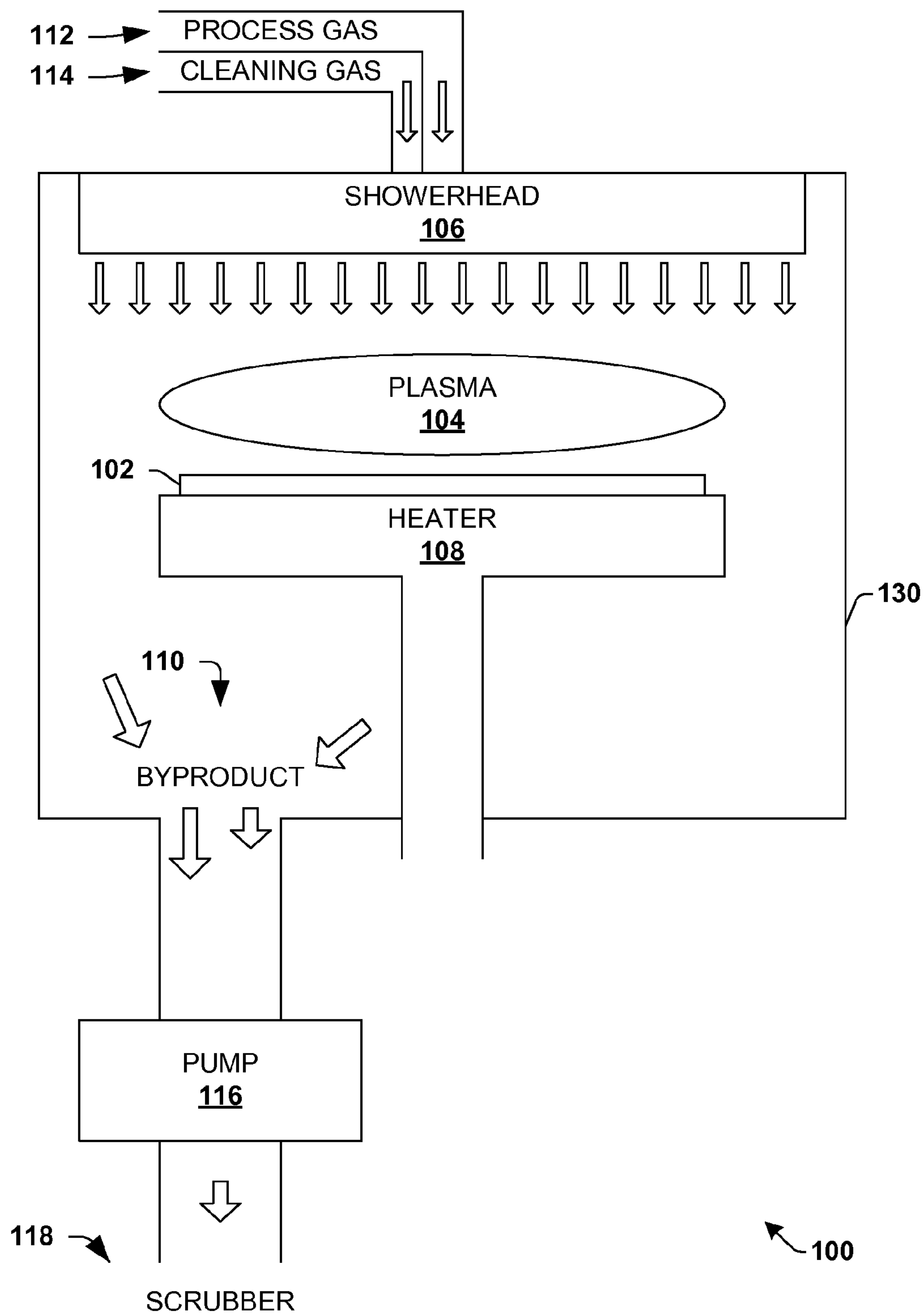
FIG. 1 is a cross sectional diagram illustrating a CVD process.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Many semiconductor fabrication processes involve utilizing a pump to pull vapor or materials from a chamber. The vapor or materials are pulled to a scrubber or other location with a particular rate or flow rate. The pump pulls the vapor or materials from various positions within the chamber at varied rates depending on the positioning of an exit point or location and the relation of the various positions to the exit point. As a result, semiconductor process uniformities can occur do to the varied rates.

One example of a semiconductor process that utilizes a pump to pull materials from a chamber is chemical vapor deposition (CVD). A chamber is used and a semiconductor device or wafer is exposed to a precursor in the form of a vapor. The precursor reacts with a surface of the semiconductor device and deposits and forms a layer of material as a film. The pump pulls the vapor at varied rates about the semiconductor device, which results in a varied film thickness or non-conformal film.

The present disclosure includes a ring or guiding device coupled to a chamber exit location to guide or facilitate more uniform flow rates throughout the chamber. As a result, more uniform fabrication results are obtained.

FIG. 1 is a cross sectional diagram illustrating a CVD process system 100. The system 100 utilizes plasma 104 and an RF frequency to deposit material onto a wafer or semiconductor device 102.

The system 100 includes the wafer 102, a plasma 104, a showerhead 106, a chamber 130, a heater 108, a byproduct exit location or port 110, a process gas 112, a cleaning gas 114, a pump 116, and a scrubber 118.

The wafer 102 is utilized to fabricate a semiconductor device through a number of processing steps. The wafer 102 has a substrate or body comprised of a semiconductor material, such as silicon. The wafer 102 can be divided or arranged with a series of dies. The wafer 102 includes larger sized wafers, such as 440 mm diameter sized wafers. Larger wafers are more susceptible to varied or non-uniform deposition film profiles.

The plasma 104 is a gas that includes a substantial percentage of atoms or molecules that are ionized. The plasma 104 is generally created by applying an electric field between electrodes in the presence of a process gas 112. The electrodes, in this example, are the showerhead 106 and the heater 108. The process gas 112 fills the void or space between the showerhead 106 and the heater 108. In one example, the electric field is an RF or AC frequency based electric field. In another example, the electric filed is a DC field.

The process gas 112 is provided by an external pump (not shown) or similar mechanism. The process gas 112 flows into the space between the electrodes via the showerhead 106, which includes a series of outlet ports for adequately dispersing the process gas 112. The process gas 112 can include a suitable precursor gas, such as dichlorosilane or silane and oxygen precursors at suitable pressures. The process gas 112 flows about the chamber 130 and eventually exits at the byproduct exit location 110 as a byproduct. The pump 116 pulls or vacuums the byproduct from the chamber at a selected removal rate. The byproduct can then be transferred to the scrubber 118 for cleaning and/or removal. The exit location 110 is typically, but not necessarily, located off center.

The plasma 104 deposits a selected material over or on a surface of the wafer 102. The selected material forms a film according to properties of the plasma 104 and the electric field. The film comprises a deposited material derived from the plasma 104. In one example, the deposited material is plasma deposited silicon nitride. The properties of the plasma 104 are at least partly dependent on the selected removal rate. However, the exit location causes varied flow rates about the wafer 102 resulting in a varied deposition rate and a non-uniform deposition of the film.

After forming the film on the wafer 102, the cleaning gas 114 is used to remove any molecules or atoms from the process gas 112 and to remove any other residual materials from the chamber 130. The cleaning gas 114 flows through the showerhead 106, through the chamber 130, and leaves at the exit location 110. Again, the exit location 110 causes varied flow rates for the cleaning gas 114, which can result in less than acceptable cleaning in some portions of the chamber and, also, can result in contaminants being present or deposited on the wafer 102.

It is appreciated that the varied flow rates and varied deposition rates about the wafer lead to the non-uniform deposition of the film. Typically, faster flow rates occur at areas or portions of the wafer 102 closest to the exit location 110. As a result, the deposition rates tend to be lower at the portions of the wafer 102 closest to the exit location 110. This leads to a thinner film at the portions closes to the exit location 110.

Figure 2:
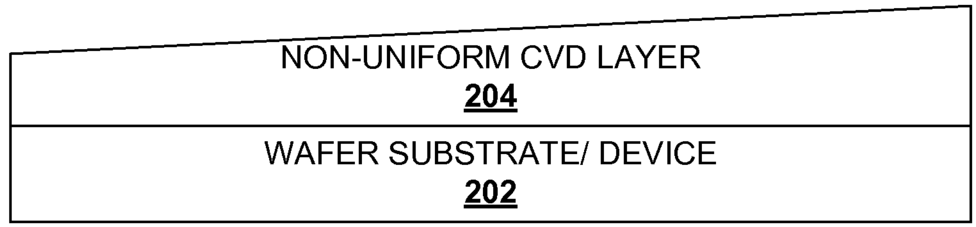
FIG. 2 is an example of a non-uniform film deposited via a CVD process using a chamber without a guiding element.

FIG. 2 is an example of a non-uniform film deposited with the system 100 of FIG. 1. In this example, a wafer 200 includes a substrate or device 202. The substrate 202 can have a variety of layers and/or semiconductor structures formed thereon and therein. Additionally, a non-uniform CVD layer 204 has been formed on the device 202 by utilizing a system such as the system 100 described above. The non-uniform layer 204 can also be referred to as having a declining film profile. The varied flow rates have led to varied deposition rates, which led to a non-uniform thickness or profile. As a result, product yield and device operation can be substantially degraded.

Figure 3:
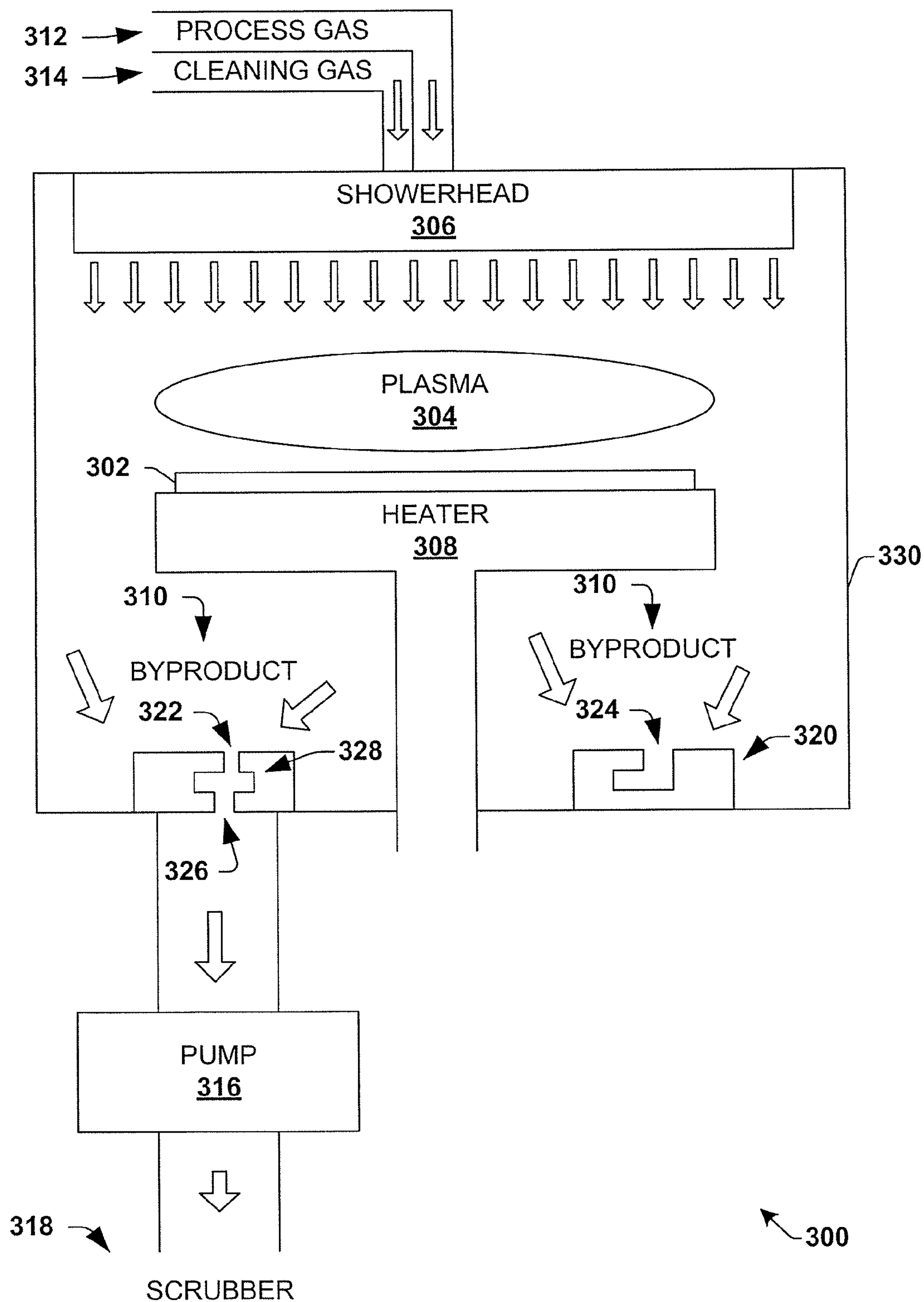
FIG. 3 is a cross sectional diagram illustrating a CVD process system in accordance with an embodiment of the disclosure.

FIG. 3 is a cross sectional diagram illustrating a CVD process system 300 in accordance with an embodiment of the disclosure. The system 300 utilizes plasma 304 and an electric field to deposit material onto a wafer or semiconductor device 302. Additionally, the system incorporates a guiding element or device to manage or control gas flow. The guiding element facilitates a conformal gas flow, thereby mitigating variations in thickness, asymmetric profiles and/or declining profiles for deposited films.

The system 300 includes the wafer 302, a plasma 304, a showerhead 306, a chamber 330, a heater 308, a guiding element 320, a byproduct exit location or port 310, a process gas 312, a cleaning gas 314, a pump 316, and a scrubber 318.

The wafer 302 is utilized to fabricate a semiconductor device through a number of processing steps. The wafer can be at one of a number of steps in a fabrication process. The wafer 302 has a substrate or body comprised of a semiconductor material, such as silicon. The wafer 302 can be divided or arranged with a series of dies. The wafer 302 includes larger sized wafers, such as 440 mm diameter sized wafers. Larger wafers are more susceptible to varied or non-uniform deposition film profiles.

The heater 308 supports the wafer 302 and provides thermal energy according to a process recipe. In one example, the heater 308 provides the thermal energy to meet a target temperature.

The plasma 304 is a gas that includes a substantial percentage of atoms or molecules that are ionized. The plasma 304 is generally created by applying an electric field between electrodes in the presence of a process gas 312. The electrodes, in this example, are the showerhead 306 and the heater 308. The process gas 312 fills the void or space between the showerhead 306 and the heater 308 and the electric field creates the plasma 304 from the process gas 312. In one example, the electric field is an RF or AC frequency based electric field. In another example, the electric filed is a DC field.

The process gas 312 is provided by an external pump (not shown) or similar mechanism. The process gas 312 flows into the space between the electrodes via the showerhead 306, which includes a series of outlet ports for adequately dispersing the process gas 312. The process gas 312 can include a suitable precursor gas, such as dichlorosilane or silane and oxygen precursors at suitable pressures. The process gas 312 flows about the chamber 330 and eventually exits at the byproduct exit location 310 as a byproduct. The pump 316 pulls or vacuums the byproduct from the chamber at a selected removal rate. The byproduct can then be transferred to the scrubber 318 for cleaning and/or removal. The exit location or port 310 is typically, but not necessarily, located off center.

The guiding element 320 is coupled to the port 310. In one example, at least a portion of the guiding element 320 covers the port and a seal mechanism prevents gas flow from entering the port 310 except through the guiding element 320. The guiding element 320 has an outlet 326 that interacts with the port 310 and passes gas to the port 310. The outlet 326 is sized to control and provide adequate flow to the port 310. In one example, the outlet 326 is sized according to a selected removal flow rate and material used in the process gas 312.

The guiding element 320 also includes a plurality of inlets 322 and 324 where gas from the chamber 330 can enter the guiding element. The inlets 322 and 324 have a size or opening selected to mitigate varied gas flow rates about the chamber 330 and about the wafer 302. In one example, the inlets 322 and 324 have a size or opening selected at least partially according to a selected removal flow rate and the material used in the process gas 312. In another example, the inlets 322 and 324 have inlet sizes that are adjustable according to process recipe, chamber configuration, removal rate, and the like. An aperture or movable component can be utilized to adjust the inlet sizes.

The guiding element 320 is comprised of a suitable material. In one example, the material is selected to mitigate interaction with the process gas 312, the cleaning gas 314, and/or other gases and materials typically utilized in CVD systems.

In this example, the guiding element 320 is in the general shape of a ring. However, it is appreciated that alternate embodiments can include other shapes. Further, the guiding element includes a transport region 328 or void that facilitates the transfer of the gas from the inlets 322 and 324 to the outlet 326.

The guiding element 320 is removably installed in the chamber 330. Thus, the guiding element 320 can be removed for other purposes including, but not limited to, use in other chambers, cleaning, adjusting or modifying the element 32, and the like.

The plasma 304 deposits a selected material over or on a surface of the wafer 302. The selected material forms a film according to properties of the plasma 304 and the electric field and a flow rate about the wafer 302. The film comprises a deposited material derived from the plasma 304. In one example, the deposited material is plasma deposited silicon nitride. The properties of the plasma 304 are at least partly dependent on the selected removal rate of the port 310. The guiding element mitigates or prevents varied flow rates about the wafer 302 resulting in a more uniform deposition rate and a more uniform deposition of the film across the wafer 302. Thus, the deposited film has a more conformal or conformal film profile.

After forming the film on the wafer 302, the cleaning gas 314 is used to remove any molecules or atoms from the process gas 312 and to remove any other residual materials from the chamber 330. The cleaning gas 314 flows through the showerhead 306, through the chamber 330, and leaves at the exit location 310. Again, the guiding element 320 mitigates varied flow rates for the cleaning gas 314, which results in more uniform cleaning across the wafer 302 and the chamber 330. As a result of the guiding element 320, acceptable cleaning throughout the chamber 330 is obtained and less contaminants are present or deposited on the wafer 302 than in some deposition systems without guiding elements. The clean efficiency is improved as compared with CVD systems that do not utilize a guiding element.

It is appreciated that the guiding element 320 results in more uniform flow rates and more uniform deposition rates about the wafer. This leads to a substantially conformal deposition of the film, particularly when compared with the system 100 and others that omit a guiding element.

It is also appreciated that alternate embodiments can utilize guiding element(s), such as element 320, for other semiconductor fabrication processes besides CVD or deposition processes. The guiding element(s) can be utilized for systems that utilize a chamber and/or gas flow.

Figure 4:
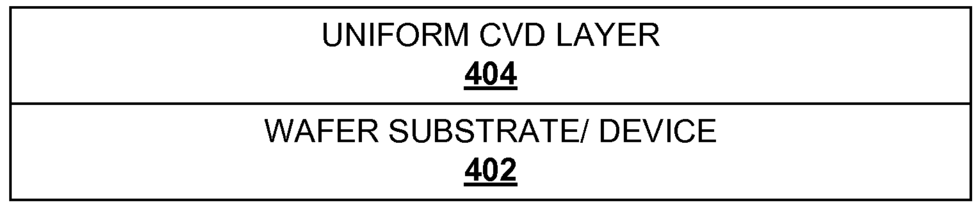
FIG. 4 is an example of a uniform film formed in accordance with an embodiment of the disclosure.

FIG. 4 is an example of a uniform film formed in accordance with an embodiment of the disclosure. In this example, a wafer 400 includes a substrate or device 402. The wafer 400 has a diameter of a suitable value. In one example, the diameter exceeds 400 mm. The substrate 402 can have a variety of layers and/or semiconductor structures formed thereon and/or therein. Additionally, a substantially uniform or conformal CVD layer 404 has been formed on the device 402 by utilizing a system such as the system 300 described above. The uniform gas flow rates, which are a result of the guiding element, have led to uniform deposition rates across the wafer 400. Therefore, the layer 404 has been formed with a substantially uniform thickness.

Figure 5A:
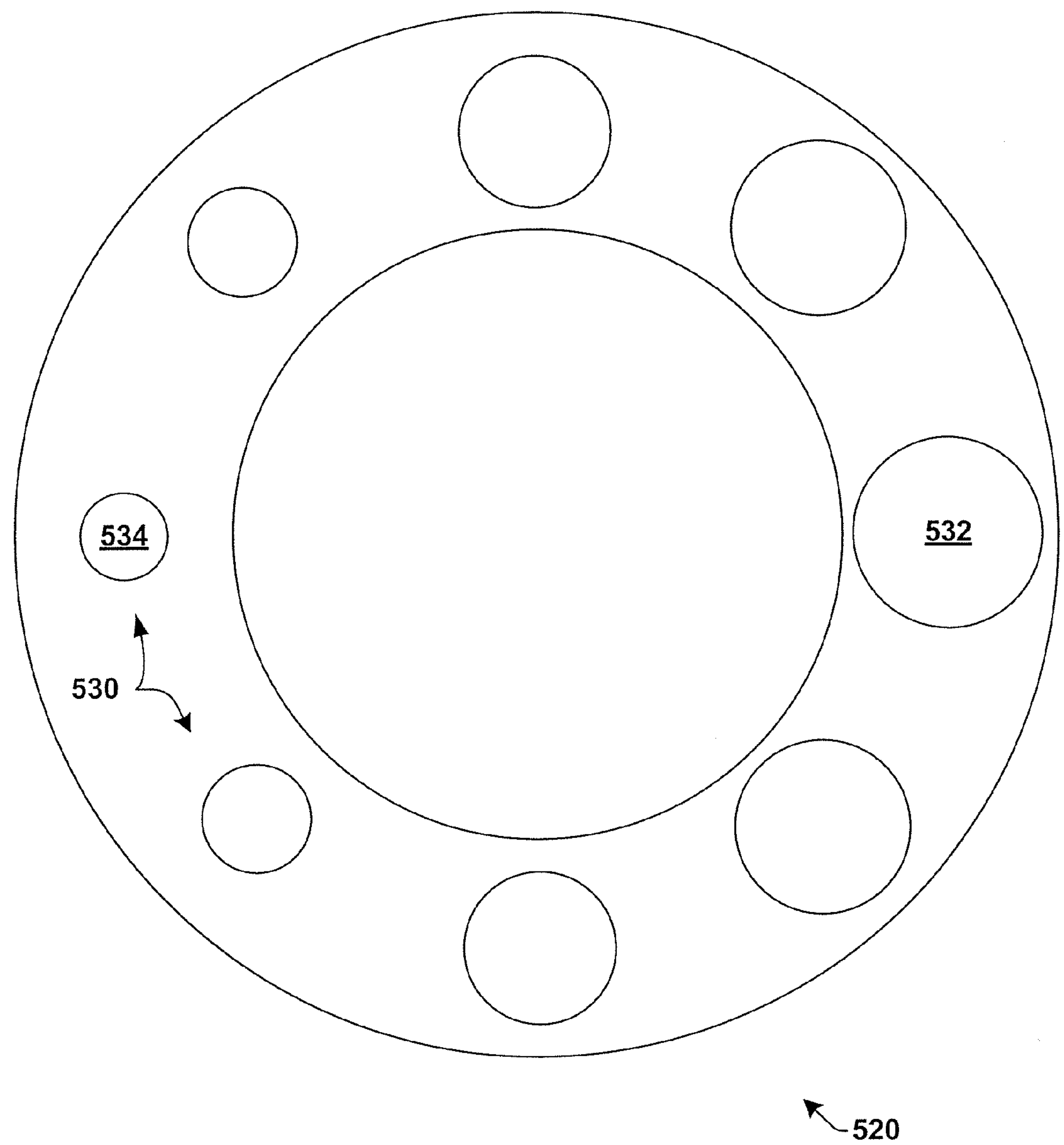
FIG. 5A is a top view illustrating a guiding element in accordance with an embodiment of the disclosure.
Figure 5B:
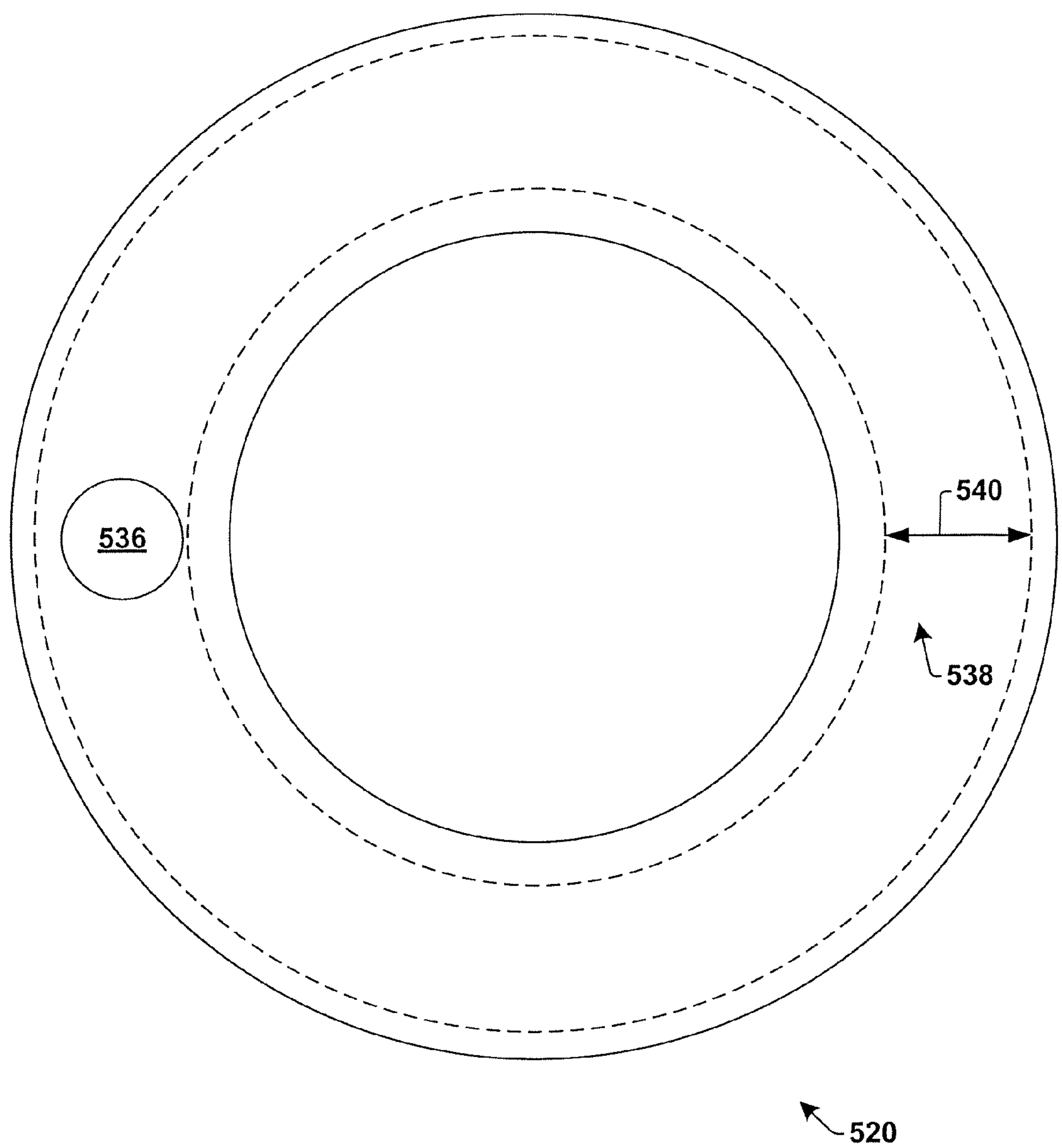
FIG. 5B is a bottom view illustrating a guiding element in accordance with an embodiment of the disclosure.

FIGS. 5A and 5B depict top and bottom views of a guiding element 520 in accordance with an embodiment of the disclosure. The guiding element 520 is shown with a particular configuration and shape in order to aid understanding. However, it is appreciated that other embodiments can include varied shapes and configurations and still mitigate varied air flow within a chamber.

FIG. 5A is a top view illustrating the guiding element 520 in accordance with an embodiment of the disclosure. The guiding element 520 includes a plurality of circular inlets 530. The inlets 530 have varied sizes in order to selectively guide gas flow into the guiding element 520. For example, inlet 534 has a relatively small diameter in order to restrict or slow gas flow and inlet 532 has a relatively large diameter in order to increase or enhance gas flow. Typically, the smallest inlet 534 is located near an exit port of a chamber and the larger or largest inlet 532 is located furthest away from the exit port of the chamber. The other inlets can have varied sizes selected to guide the gas flow within the chamber.

Although the inlets 530 are shown with circular shapes, it is appreciated that alternate embodiments can utilize other shapes. Furthermore, it is also appreciated that alternate embodiments can use a single inlet that stretches around the guiding element 520 and includes a varying width to selectively guide the gas flow out of the chamber.

Additionally, the inlets 530 can include apertures or similar components to permit adjusting the inlet sizes as needed. Thus, variations in process recipe and the like can be accounted for by altering the inlet sizes.

FIG. 5B is a bottom view illustrating the guiding element 520 in accordance with an embodiment of the disclosure. The guiding element 520 includes a single outlet or exit port 536. The exit port 536 has a shape selected to yield or accommodate a desired exit gas flow out of the chamber. In this example, the outlet 536 is shown with a circular shape, however it is appreciated that alternate shapes are contemplated.

The outlet 536 is typically positioned such that it matches or corresponds with an exit port of the chamber. In one example, a seal is present around the outlet 536 and between portions of the guiding element 520 and portions of the chamber.

The guiding element 520 also includes a transport region 538 within in order to transport the gas from the inlets 530 to the outlet 536. The transport region 538 is sized 540 so as to accommodate the gas flow out of the chamber.

Figure 6:
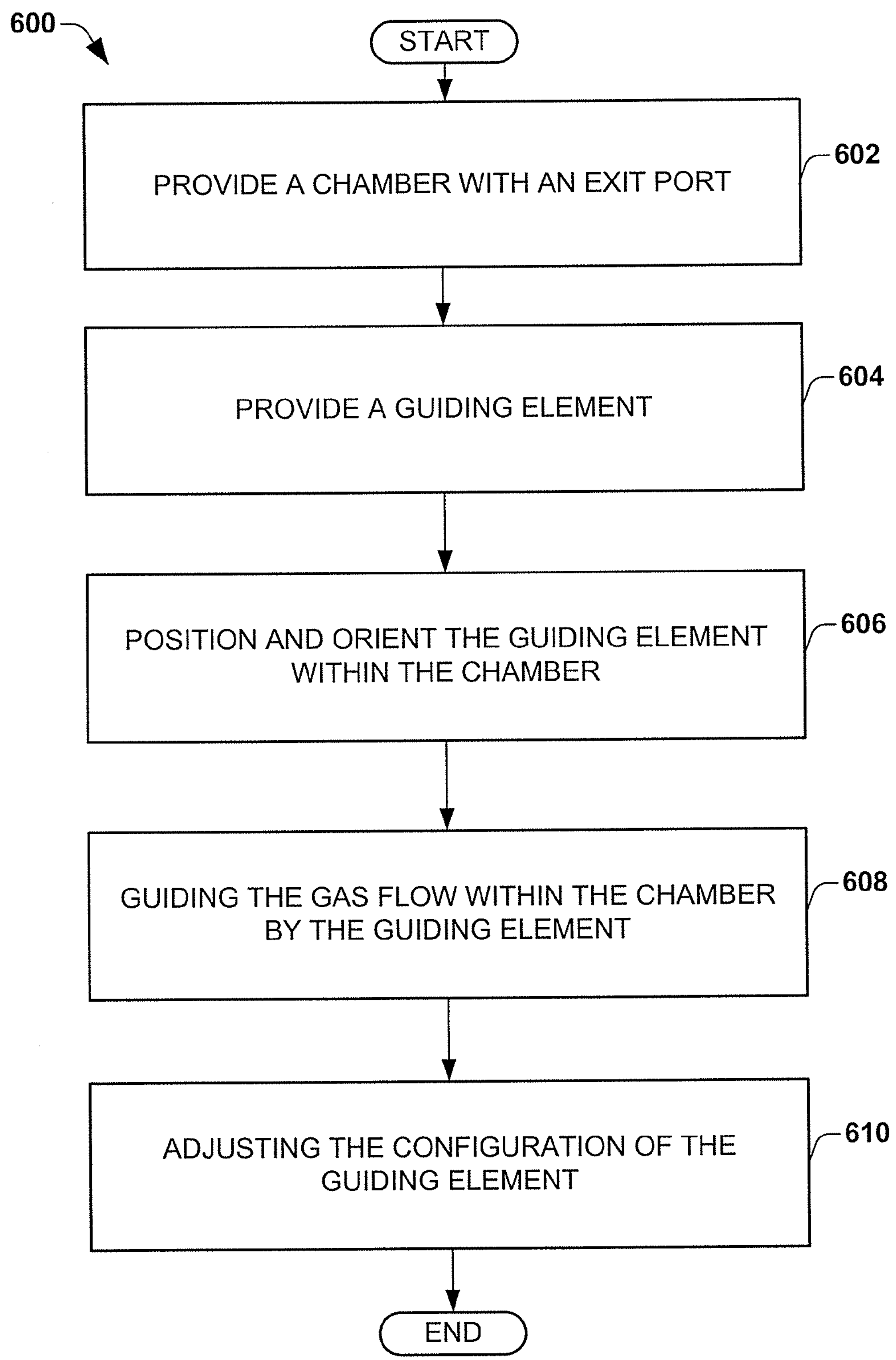
FIG. 6 is a flow diagram illustrating a method of guiding gas flow in a chamber in accordance with an embodiment of the disclosure.

FIG. 6 is a flow diagram illustrating a method 600 of guiding gas flow in a chamber in accordance with an embodiment of the disclosure. The method 600 mitigates gas flow variations throughout the chamber. In one example, the method 600 mitigates the gas flow variations, which results in a more uniform deposition rate and a more uniform or conformal deposited film.

The method begins at block 602, wherein a chamber having an exit port is provided. The chamber is typically utilized in semiconductor fabrication. In one example, the chamber is utilized for chemical vapor deposition processes using plasma. The exit port is configured to remove gas and/or byproducts from the chamber. The chamber can include additional components such as, a heater, a showerhead for distributing a gas, an inlet line for supplying a process gas, a second inlet line for supplying a cleaning gas, electrical connections for applying an electric field, and the like.

A guiding element is provided at block 604. The guiding element is configured to guide gas flow within the chamber. One or more inlets are formed on a first side of the guiding element. The one or more inlets have inlet sizes according to a relative position to the exit port. Generally, the closer to the exit port, the smaller the inlet size. An outlet is formed on a second side of the guiding element. The outlet is formed to have an outlet size according to a selected gas removal rate. The second side is opposite the first side.

The guiding element is positioned within the chamber at block 606. The guiding element is generally positioned so as to be proximate or cover the exit port. A seal or similar mechanism can be utilized to ensure that gas or materials exiting the chamber exit via the guiding element and the exit port.

The guiding element guides gas flow within the chamber at block 608. The configuration of the guiding element mitigates variations in gas flow rates around the chamber. As a result, semiconductor processes, such as plasma enhanced chemical vapor deposition processes, operate with substantially uniform deposition rates across a surface of a wafer. Thus, substantially conformal film or layers can be formed on semiconductor devices.

The configuration of the guiding element can be adjusted at block 610 according to chamber design, process recipe, and the like. For example, the inlet sizes can be adjusted according to the process recipe, such as a deposition rate, a type of process gas used, a type or size of electric field, a size of the wafer, and the like. Further, the guiding element can be replaced with a second guiding element within the chamber to account for variations in the process recipe and/or chamber variations. Additionally, the guiding element can be removed from the process chamber to be utilized in another chamber, for cleaning, and the like.

In one embodiment, the present disclosure includes a guiding element for guiding gas flow within a chamber. The guiding element includes a structure, one or more inlets, an outlet, and a transportation region. The one or more inlets are formed on a first side of the structure. The inlets have inlet sizes selected according to a removal rate and to mitigate gas flow variations within the chamber. The outlet is on a second side of the structure, opposite the first side of the structure. The outlet has an outlet size selected according to the removal rate. The transportation region is within the structure and couples or connects the inlets to the outlet.

In another embodiment of the disclosure, a semiconductor process system is disclosed. The system includes a chamber, a showerhead, a heater, and a guiding element. The chamber includes an exit port for removal of gas and/or byproducts. The showerhead is located at a top portion of an interior of the chamber and is configured to distribute a gas, such as a process gas and/or a cleaning gas. The heater is located within the chamber and below the showerhead. The heater is configured to yield a selected temperature. The guiding element is located within the chamber and covers the exit port. The guiding element mitigates gas flow variations within the chamber. The guiding element includes an inlet, an outlet, and a transport region within a structure. The transport region is coupled to the inlet and the outlet.

In yet another embodiment of the disclosure, a method of guiding gas flow within a process chamber is disclosed. A chamber having an exit port is provided. The exit port permits removal of gas and/or byproducts. A guiding element is configured. In one example, one or more inlets are formed on a first side of the guiding element. The one or more inlets have inlet sizes according to a relative position to the exit port. An outlet is formed on a second side of the guiding element. The outlet is formed to have an outlet size according to a selected gas removal rate. The second side is opposite the first side. The guiding element is positioned within the chamber to be proximate or cover the exit port. The guiding element guides gas flow within the chamber to mitigate gas flow variations.

It will be appreciated that while reference is made throughout this document to exemplary structures in discussing aspects of methodologies described herein (e.g., the structure presented in FIGS. 1-5B, while discussing the methodology set forth in FIG. 6), that those methodologies are not to be limited by the corresponding structures presented. Rather, the methodologies (and structures) are to be considered independent of one another and able to stand alone and be practiced without regard to any of the particular aspects depicted in the Figs.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms “includes”, “having”, “has”, “with”, and/or variants thereof are used herein, such terms are intended to be inclusive in meaning—like “comprising.” Also, “exemplary” is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A semiconductor process system comprising:

a guiding element structure arranged within a chamber;

one or more inlets formed on a first side of the guiding element structure, the one or more inlets having inlet sizes selected according to a removal rate and to mitigate gas flow variations;

an outlet formed on a second side of the guiding element structure and having an outlet size selected according to the removal rate, the second side being on a bottom of the guiding element structure;

a transportation region within the guiding element structure and coupled to the one or more inlets and the outlet;

a seal encircling the outlet, and configured to seal an interface between the outlet and an exit port of the chamber; and a wafer support arranged in the chamber and directly above the guiding element structure;

wherein the guiding element structure is configured to pass all gas flowing into the transportation region from the one or more inlets to the exit port through the outlet.

2. The semiconductor process system of claim 1, wherein the one or more inlets include only a single inlet stretching around the guiding element structure and including a varying width to selectively guide gas flow into the guiding element structure.

3. A semiconductor process system comprising:

a chamber having an exit port;

a showerhead located at a top portion of the chamber, the showerhead configured to distribute a process gas;

a heater located below the showerhead within the chamber, the heater configured to yield a selected temperature;

a guiding element arranged directly under the heater and comprising:

a structure;

one or more inlets formed on a first side of the structure, the one or more inlets having inlet sizes selected according to a removal rate and to mitigate gas flow variations;

an outlet formed on a second side of the structure and having an outlet size selected according to the removal rate, the second side being on a bottom of the structure; and a transportation region within the structure and coupled to the one or more inlets and the outlet; and a seal encircling the outlet;

wherein the guiding element is positioned within the chamber with an interface between the outlet and the exit port sealed by the seal, wherein the guiding element is configured to pass all gas flowing into the transportation region from the one or more inlets to the exit port through the outlet, and wherein the guiding element mitigates gas flow variations within the chamber.

4. The semiconductor process system of claim 3, wherein the heater supports a wafer.

5. The semiconductor process system of claim 4, further comprising a plasma generating element configured to form a plasma above the wafer.

6. The semiconductor process system of claim 5, wherein the plasma deposits a material on the wafer at a substantially uniform rate across a top surface of the wafer, wherein a conformal film is formed over the wafer.

7. The semiconductor process system of claim 3, further comprising a pump coupled to the exit port and a scrubber coupled to the pump, wherein the pump is configured to remove byproducts from the chamber and the scrubber is configured to process the byproducts.

8. The semiconductor process system of claim 3, wherein the one or more inlets comprise a plurality of circular sized openings.

9. The semiconductor process system of claim 3, wherein the one or more inlets comprise only a single opening having a varying width.

10. The semiconductor process system of claim 3, wherein the showerhead is further configured to distribute a cleaning gas.

11. The semiconductor process system of claim 3, wherein the guiding element is formed of a material configured to minimize interactions with the process gas.

12. The semiconductor process system of claim 3, wherein the guiding element is removably positioned within the chamber.

* * * * *